United States Patent
Yu et al.

(10) Patent No.: US 6,662,066 B1
(45) Date of Patent: Dec. 9, 2003

(54) DYNAMIC ADJUSTMENT AND AUTO GENERATION OF WATER PER HOUR (WPH) IN CAPACITY CHECK SYSTEM (CCS) BY TOOL PERFORMANCE TRACKING PLATFORM (TP2)

(75) Inventors: Lin Chien Yu, Taipei (TW); Ni Chung Cheng, Hsin-chu (TW); Lin Jia Suen, I-Lan (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 10/131,273

(22) Filed: Apr. 23, 2002

(51) Int. Cl.⁷ ............................................. G06F 19/00
(52) U.S. Cl. ........................ 700/108; 700/112; 700/169
(58) Field of Search ................................. 700/108, 112, 700/125, 111, 100, 169, 99; 705/8

(56) References Cited

U.S. PATENT DOCUMENTS

| | | | | |
|---|---|---|---|---|
| 4,531,182 A | * | 7/1985 | Hyatt ........................ | 700/180 |
| 5,195,041 A | * | 3/1993 | George et al. .............. | 700/100 |
| 5,790,406 A | * | 8/1998 | Dunn et al. ................. | 700/169 |
| 5,897,478 A | * | 4/1999 | Harding et al. ............. | 493/22 |
| 5,966,694 A | | 10/1999 | Rothschild et al. .......... | 705/7 |
| 6,163,761 A | | 12/2000 | Kent .......................... | 702/187 |
| 6,398,336 B1 | * | 6/2002 | Yoda et al. .................. | 347/23 |

OTHER PUBLICATIONS

"Tool Performance Tracking Platform (TP2)", Int'l SEMATECH Project, Mar. 2000, Harvey Wohlwend, pp. 1–14.
Int'l SEMATECH, "Automatic Data Collection Baseline Requirements: Levels 1 & 2 Events and Variables," 2000 Int'l SEMATECH, Inc.
PROMIS, MES Software suite from PRI Automation, Inc. of Billerica, MA. 2001.

* cited by examiner

Primary Examiner—Albert W. Paladini
(74) Attorney, Agent, or Firm—George O. Saile; Stephen B. Ackerman; Billy Knowles

(57) ABSTRACT

A manufacturing execution system determines production rates of tool elements of a manufacturing system and from the production rates, the efficiency of the tool elements and the efficiency of the manufacturing process system. The manufacturing execution system is in communication with a plurality of tool elements of the manufacturing process system. The manufacturing execution system includes a process data collection device, a data retaining device such as a memory, a time recording device, and a production rate calculator. The process data collection device is in communication with sensors located on the tool elements to receive tool element status data. The data retaining device is in communication with the process data collection device to record and retain the tool element status data. The time recording device records times of changes of the tool element status data to the data retaining device. The production rate calculator receives the records of times of changes of tool element status data and from the records of times of changes determining the product fabrication rate for the manufacturing system. The production rate calculator is an apparatus that executes a method for determining the production rate of the individual tool elements, the production rate of the manufacturing process system, and the efficiency of the manufacturing process system.

50 Claims, 4 Drawing Sheets

*FIG. 1 — Prior Art*

DYNAMIC ADJUSTMENT AND AUTO GENERATION OF WATER PER HOUR (WPH) IN CAPACITY CHECK SYSTEM (CCS) BY TOOL PERFORMANCE TRACKING PLATFORM (TP2)

BACKGROUND OF THE INVENTION

1. Field of the Invention

This invention relates to systems and methods for automating tracking and control of product fabrication machines. More particularly this invention relates to systems and methods for monitoring product fabrication rates and product fabrication machine efficiency.

2. Description of Related Art

Automated manufacturing systems have improved the productivity of manufacturing firms. The tool elements of a manufacturing system must be organized to produce the total product set that is marketed by the firm. To insure that the tool elements are used efficiently, a manufacturing execution system (MES) controls the operation of the tool elements and monitors the performance of the tool elements. Each tool element has actuators to activate the functions of the tool element and sensors to monitor the process of the tool element in performing its set of operations.

The MES environment provides the structure through which the structure, process, scheduling, and progress of a manufacturing process is defined, implemented, and executed. An industrial engineering or process engineering group defines the process or creates a recipe for a particular product to be fabricated. The definition is transmitted to the factory floor or process line where the process is implemented. Various tool elements are programmed to perform the various steps of the fabrication process and sensors within the tool elements are enabled to transfer status and tool element condition for monitoring the quality of the fabricated product.

The equipment engineering group is an engineering group within the manufacturing firm's organization responsible for the design and performance of the individual tool elements. In the design and construction of the tool elements for the process line, the equipment engineering group determines or designs the tool elements to have a particular product fabrication rate capacity. Thus a measure of the performance of each tool element and the factory floor or process line is the actual rate of product fabrication. The actual rate of product fabrication is then compared with the designed or planned fabrication to determine a tool element or process line efficiency rating.

PROMIS is an MES software suite from PRI Automation, Inc. of Billerica, Mass. that provides specialty MES solutions for the semiconductor and the precision electronics industries. The solutions include process definition, version control for manufacturing operations, and monitoring and management of the tool elements of the process line or factory floor. The monitoring and management of the tool elements includes interface to the tool element automation actuators and sensors to control the function of the tool elements of each tool element. Further, the monitoring and management includes tracking progress of work-in-process as the product is fabricated. Part of the tracking includes monitoring the conditions of each tool element as the tool element performs a particular process. This includes recording the beginning and ending times of a particular process, the transport time of the work-in-process between tool elements, and recording the time of any error or alarms when a tool element malfunctions and when the malfunction is corrected and the process resumes. Further, the monitoring includes recording the duration of any time that the tool elements are idle. The idle time includes any time that a tool element is waiting for the arrival of work-in-process from preceding tool element.

International Sematech, Inc. is a consortium of semiconductor and integrated circuit manufacturing firms that have joined their resources to advance the semiconductor and integrated circuit technology. International Sematech, Inc. has promulgated a Tool Performance Tracking Platform (TP2) that provides a standard interface for gathering tool element performance information. The TP2 program automatically measures the productive time or the time a tool element is performing a manufacturing process, the idle time (standby time) or the time the tool element is waiting to begin the next process on a work-in-process, alarm duration time (interrupt time) or the time that a tool element has an error or fault condition, and the transport time or the time the work-in-process is being moved between tool elements. The Tool Performance Tracking System further allows these times to be measured by tool element, groups of tool elements, by the process or recipe, by the individual or group (lot) of the work-in-process. These time measurements allow for the monitoring of the capacity of each tool element and for all the tool elements involved in a manufacturing process. In semiconductor processing the group of tool elements will be an individual processing chamber that will process a lot of wafers (the work-in-process).

Refer now to FIG. 1 for a discussion of the method and system employed for measuring the capacity of manufacturing process or an individual tool element of the prior art. Each tool element 10 that is present on the factory floor is connected to the MES environment data base 20 to provide the necessary actuation and control to configure each tool element 10 to perform a series of processes as defined by the recipe or product plan upon a work-in-process to fabricate a particular product. In the case of a semiconductor fabrication line, the chambers receive a lot of wafers and perform the necessary process steps to form integrated circuits upon the surface of the wafers. Each sensor on the tool elements then provide the necessary condition and status information to allow monitoring of the progress of each process step and the time for the processing. Traditionally the check-in (begin of a process) or check-out (end of a process) time is manually extracted (Box 30) from the MES environment database 20. The times are collected according to a recipe and the amount of fabricated products (wafers for semiconductor processing) or lots of fabricated products processed per unit time (i.e. wafers per hour) are then calculated (Box 40). The number of fabricated products or lots of fabricated products processed is usually termed throughput. Upon completion of the calculation of the throughput 40 the MES environment database 20 is manually updated (Box 50). The throughput for each recipe is extracted from the MES environment database 20 and combined (Box 60) with the frequency of use of each recipe as planned and a capacity check system report 70 is generated.

The frequency of Box 60 is the number of performances of a given process. The capacity being the amount of production of the fabrication facility. The capacity for production of the various tool elements employed in each process is then calculated to determine the capacity for the fabrication facility. By multiplying the capability of each process and the tool element used in the process times the number of times the process is executed, any bottlenecks with in the fabrication facility can be determined. Understanding the capacity capabilities of the fabrication facility allows verification for planned future production.

The capacity of the factory floor or manufacturing process line is compared (Box 80) with the planned capacity to determine the efficiency of the factory floor or manufacturing process line. The extracting (Box 30), calculating the throughput (Box 40), and the updating (Box 50) MES environment database 20 is time consuming and manually intensive and thus cannot be performed and adjusted on a continuous basis.

U.S. Pat. No. 6,163,761 (Kent) describes a method and system for monitoring and controlling factory production. The method and system are capable of handling dynamic process production data. The electronic production system includes a memory; an input/output interface for receiving production data from a plurality of sensors detecting operation of a plurality of processes for a facility; and a processor. The processor includes a plurality of dynamically operating software modules, each responsive to the production data of a respective process for storing and dynamically updating the production data in the memory; an event log generator, responsive to the production data stored in the memory, for generating event logs and for transmitting the event logs to a management system connected to the input/output interface; and a graphic user interface, responsive to the dynamically operating software modules updating the production data, for displaying the production data graphically and dynamically as the production data changes. The electronic production system, as well as vertical integration from processes to the management system of the facility, and horizontal integration of diverse applications effect improved efficiency and inventory tracking.

U.S. Pat. No. 5,966,694 (Rothschild, et al.) illustrates a cycle time costing method and apparatus that obtains cost, efficiency, bottleneck and value creation information in a manufacturing facility. The manufacturing facility includes a plurality of production lines with each production line including a plurality of process steps. A work cell, which includes a plurality of workers or automated tool elements, is responsible for each process step. Each work cell has an associated local processing apparatus for inputting process step quantity and time information. The local processing apparatus is coupled to a central processing apparatus via local area network. The central processing apparatus then calculates cycle time costing information regarding each work cell in the manufacturing facility. The cycle time costing information may include, among other information, gross cycle time, net cycle time, bottleneck costs and scrap information for each process step and/or a product manufactured by a plurality of process steps. The cycle time cost information is then transferred to a printer or projection display nearby a work cell.

SUMMARY OF THE INVENTION

An object of this invention is to provide a method and apparatus for determining a production rate for a tool element within in a manufacturing system.

Another object of this invention is to provide a method and apparatus for determining, from the production rate, an efficiency of a tool element within a manufacturing system.

Still further another object of this invention is to provide a manufacturing execution system, which determines production rate of individual tool elements of a manufacturing process system and from the production rate of the individual tool elements, determines the production rate of the manufacturing process system.

Yet another object of this invention is to provide a manufacturing execution system, which determines from production rates of tool elements of the manufacturing process system, the efficiency of the tool elements and the efficiency of the manufacturing process system.

To accomplish at least one of these objects and other objects, a manufacturing execution system is in communication with a plurality of tool elements of a manufacturing process system. The manufacturing execution system includes a process data collection device, a data retaining device such as a memory, a time recording device, and a production rate calculator. The process data collection device is in communication with sensors located on the tool elements to receive tool element status data. The data retaining device is in communication with the process data collection device to record and retain the tool element status data. The time recording device records times of changes of the tool element status data to the data retaining device. The production rate calculator receives the records of times of changes of tool element status data and from the records of times of changes determining the product fabrication rate for the manufacturing system.

The production rate calculator is an apparatus that executes the method for determining the production rate of the individual tool elements, the production rate of the manufacturing process system, and the efficiency of the manufacturing process system. The method for determining the production rate begins by measuring the tool operation time for each tool element of the manufacturing system engaged in the manufacturing process.

The tool operation time is that time where the tool element is in operation to produce product. Therefore the measuring of the tool operation time must first determine whether the tool element is operating to produce the product. The time recording device then records the entry time. The entry time is the time at which the work-in-process enters the tool element. If a fault or malfunction of the tool element occurs an alarm event time is recorded. If the particular process for a unit of the work-in-process is complete the time recording device records an operation complete time. The production rate calculator determines the sequence of the alarm event times. A successful completion of the process of the tool element is indicated when the alarm event time occurs prior to the occurrence of the operation complete time. If the alarm event time is later than the operation complete time, the tool operation time is set as a difference between the alarm event time and the entry time. However, if the operation complete time is later than the alarm event time, the tool operation time is set as the difference between the operation time complete and the entry time.

The method then continues by next measuring an alarm duration time during fault conditions for any of the tool elements. The alarm duration time is determined by recording an alarm event time and an alarm clear time. The alarm event time is a time at which the tool element has a fault condition or malfunction and ceases operation. The alarm clear time is a time at which the tool element fault condition is corrected and the tool element able to function. The alarm duration time is determined as the difference between the alarm clear time and the alarm event time.

Next the method continues by measuring the idle duration time of each of the tool elements. The idle duration time is measured by first recording a tool element operational time. The tool element operational time is a time at which the tool element is set to be able to function. Next the alarm clear time is recorded. The alarm clear time is the time at which a tool element fault condition is corrected and the tool element able to function. Then the previous work-in-process exit time is recorded. The previous work-in-process exit time is the time at which a previous work-in-process is removed from the tool element. A next work-in-process entry time is then recorded. The next work-in-process entry time is the time at which the next work-in-process enters the tool element. The idle duration time is then determined as the difference between the next work-in-process entry time and a latest time of the tool element operational time, the alarm clear time, and the previous work-in-process exit time.

The method further measures a product transport time. The product transport time indicates an amount of time that a work-in-process is being transported between tool elements. The measuring the product transport time begins by recording the exit time at which the work-in-process is removed from a previous tool element (ROBOT ARM START) and recording the entry time at which the work-in-process is placed in a next tool element (ROBOT ARM COMPLETE). The transport time is determined as the difference between the exit time and the entry time.

All the tool operation times terminated with an alarm event time are discarded. The remaining tool operation times are then averaged to create an average tool operation time and the standard deviation of all tool operation times is found. All tool operation times greater than and less than a sum and difference of the average tool operation time and a multiplication factor of the standard deviation (i.e. 3 standard deviations). All tool operation times not discarded are then summed with the product transport times, and the idle duration times. The number of products fabricated is then divided by the summed tool operation times, product transport times, and the idle duration times.

The fabricated products are grouped in fabrication lots and the tool operation time indicates a time to fabricate one lot of fabricated product and the transport time is the time to transport the fabrication lot. The unit transport time must then be calculated from the number of units of fabricated products per lot.

The efficiency of the manufacturing system is determined by the manufacturing execution system by acquiring a planned manufacturing system production rate from an engineering planning system in communication with the manufacturing execution system. The production rate calculator then calculates the production efficiency factor by comparing the planned manufacturing system production rate as a percentage of the determined product fabrication rate.

DETAILED DESCRIPTION OF THE INVENTION

Figure 1:
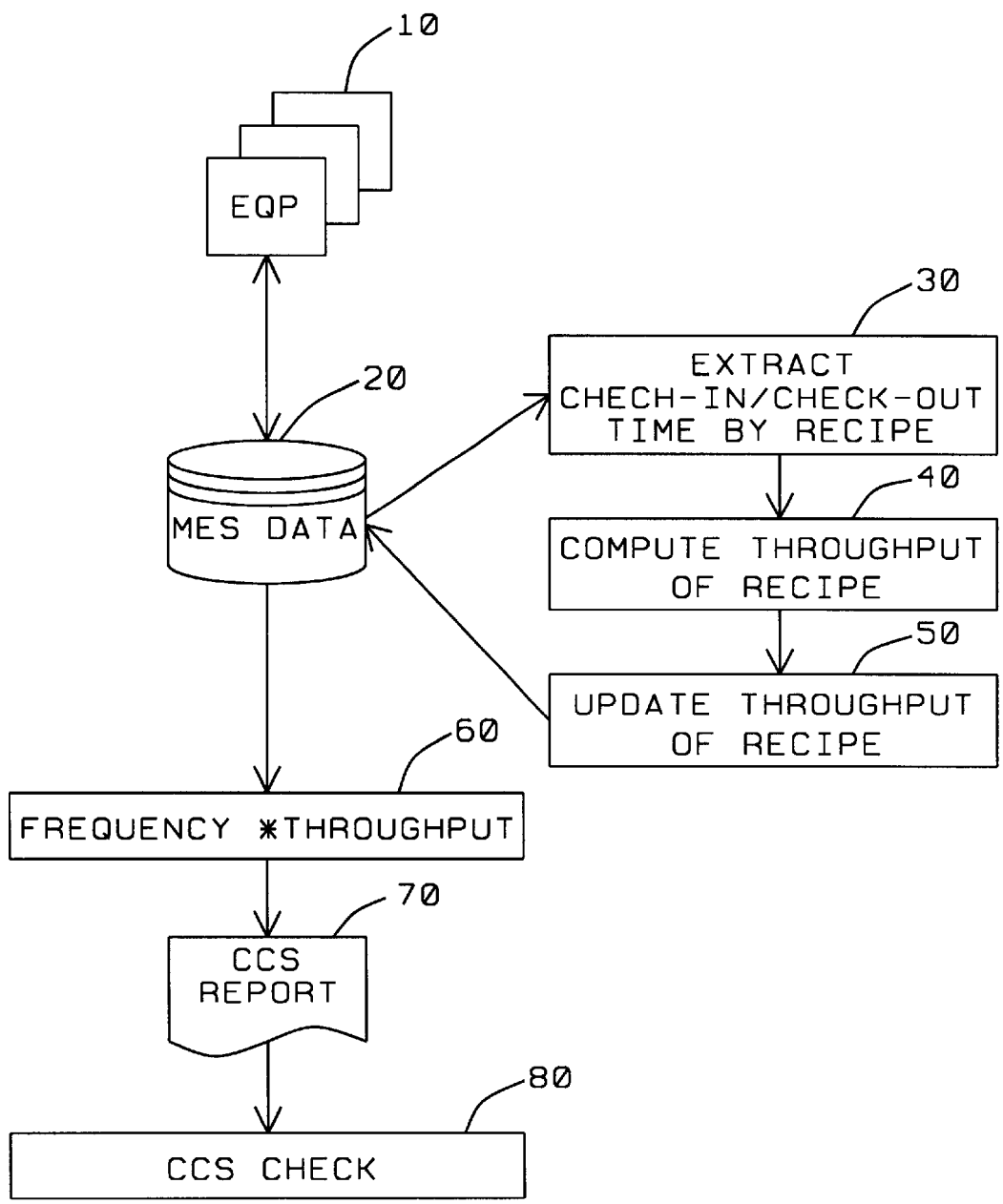
FIG. 1 is a Manufacturing Execution System Process diagram of the prior art.
Figure 2:
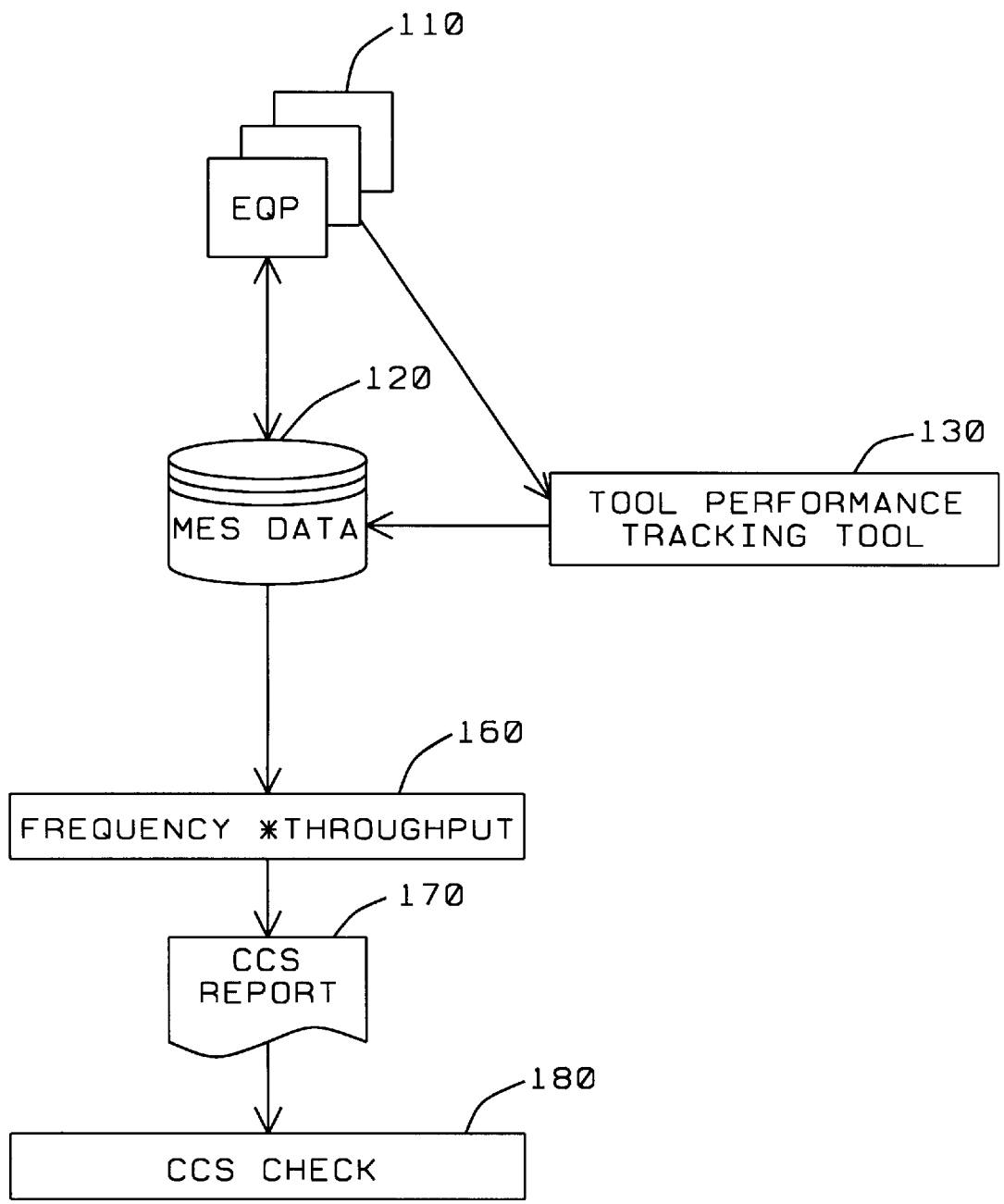
FIG. 2 is a Manufacturing Execution System Process diagram of a first embodiment of this invention.

As described in FIG. 1, the extracting (Box 30), calculating the throughput (Box 40), and the updating (Box 50) MES environment database 20 is time consuming and manually intensive and thus cannot be performed and adjusted on a continuous basis. In the method and apparatus of this invention, as shown in FIG. 2, a tool performance tracking tool 130 such as the Tool Performance Tracking Platform (TP2) from International Sematech, Inc. is in communication with the tool elements 110 of the manufacturing system to receive the data provided by sensors incorporated in the tool elements 110. The tool performance tracking tool 130 provides a standard interface to receive the data from the sensors of the tool elements 110. Upon receiving the data, the tool performance tracking tool 130 records a time of occurrence of events as determined by the data from the sensors. The events recorded include:

operational status of a tool element;
    tool element operational to process work-in-process, or
    tool element in maintenance for repair or redesign of process;
    entry of a work-in-process to a tool element;
    exit of a work-in-process from a tool element;
    begin process of a work-in-process;
    successful completion of the processing of a work-in-process;
    alarm event indicating an fault condition or malfunction of the tool element; and
    clearing of the fault condition or malfunction to allow the tool element to be operational for processing a work-in-process.

The events recorded are not the only events that may be recorded and still be in keeping with this invention.

Figure 4:
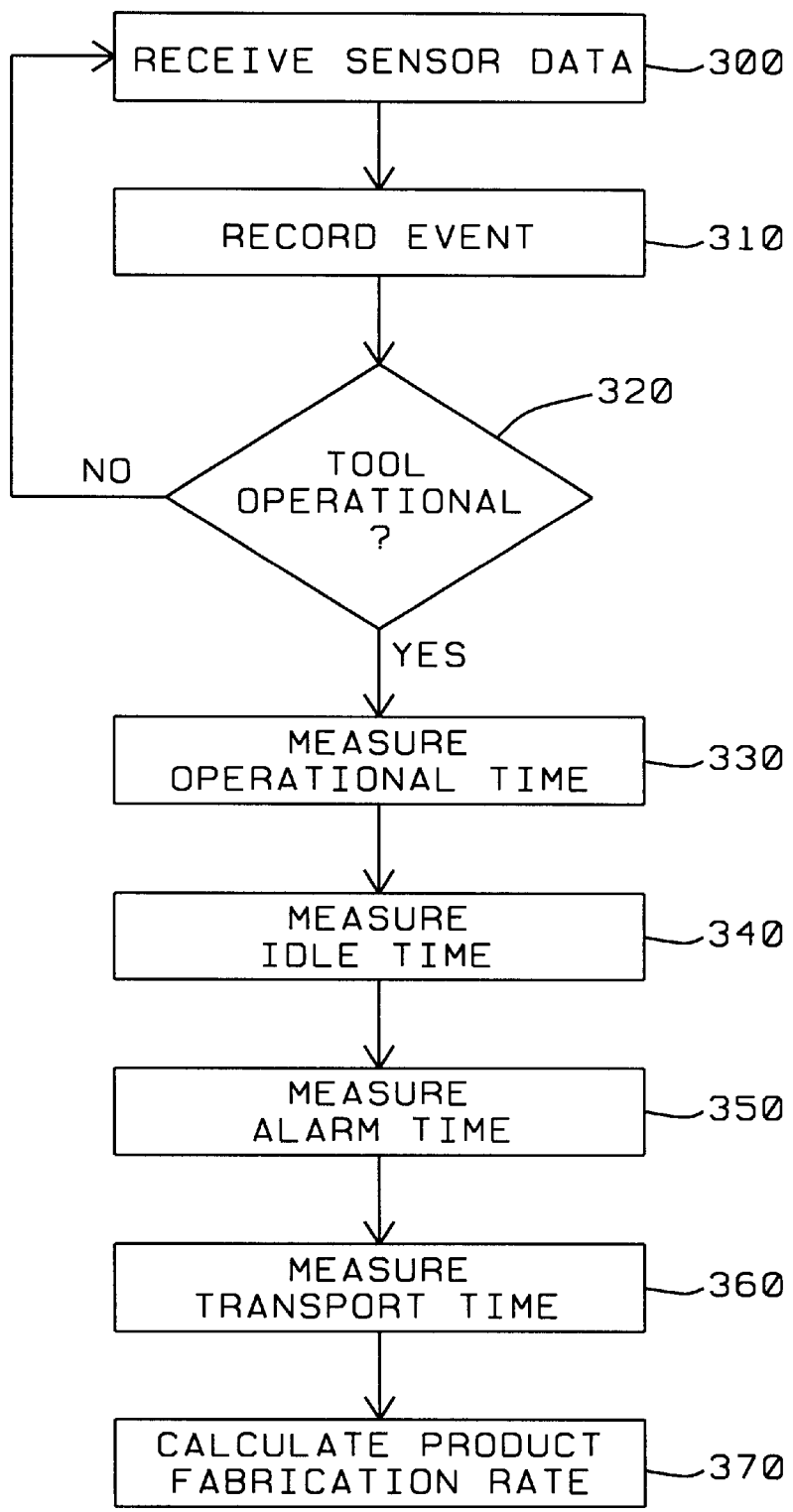
FIG. 4 is flow diagram of the method to calculate the product fabrication rate of this invention.

Refer now to FIG. 4 for a discussion of the measurement and calculation of the product fabrication rate of this invention. The tool performance tracking tool 130 receives (Box 300) the sensor data and records (Box 310) the type of event (operational, alarm, or idle) and records the time of occurrence. The tool element for which the event is being recorded is queried (Box 320) whether it is operational for product fabrication. If it is not operational for fabrication, the tool element must be either having maintenance performed or having a process redesign installed. The tool performance tracking tool 130 returns to receive the next sensor data (Box 300). Depending on the type of event recorded, the tool performance tracking tool measures either the tool operation or productive time (Box 330), the idle time (Box 340), or the alarm duration time (Box 350), or the transport time (Box 360).

The tool operation time is that time where the tool element is in operation or productive. The tool performance tracking tool 130 has a time recording device that has recorded (Box 310) the entry time. The entry time is the time at which the work-in-process enters the tool element. If a fault or malfunction of the tool element occurs, an alarm event time is recorded (Box 310). If the particular process for a unit of the work-in-process is complete the time recording device has recorded an operation complete time. The tool tracking performance platform has a production rate calculator that determines the sequence of the alarm event times. A successful completion of the process of the tool element is indicated when the alarm event time occurs prior to the occurrence of the operation complete time. If the alarm event time is later than the operation complete time, the tool operation time is set as a difference between the alarm event time and the entry time. However, if the operation complete time is later than the alarm event time, the tool operation time is set as the difference between the operation time complete and the entry time.

The idle duration time of each of the tool elements is measured (Box 340) by first recording a tool element operational time. The tool element operational time is a time at which the tool element is set to be able to function as measured in Box 330. Next the alarm clear time is recorded. The alarm clear time is the time at which a tool element fault condition is corrected and the tool element able to function. Then the previous work-in-process exit time is recorded. The previous work-in-process exit time is the time at which a previous work-in-process is removed from the tool element. A next work-in-process entry time is then recorded. The next work-in-process entry time is the time at which the next work-in-process enters the tool element. The idle duration time is then determined as the difference between the next work-in-process entry time and a latest time of the tool element operational time, the alarm clear time, and the previous work-in-process exit time.

The alarm duration time during fault conditions for any of the tool elements is determined (Box 350) by recording an alarm event time and an alarm clear time. The alarm event time is a time at which the tool element has a fault condition or malfunction and ceases operation. The alarm clear time is a time at which the tool element fault condition is corrected and the tool element able to function. The alarm duration time is determined as the difference between the alarm clear time and the alarm event time.

The measuring (Box 360) of the transport time indicates the amount of time that a work-in-process is being transported between tool elements. The measuring (Box 360) of the product transport time begins by recording the exit time at which the work-in-process is removed from a previous tool element (ROBOT ARM START) and recording the entry time at which the work-in-process is placed in a next tool element (ROBOT ARM COMPLETE). The transport time is determined as the difference between the exit time and the entry time.

The tool performance tracking tool 130 has a fabrication performance calculator to compute (Box 370) the product fabrication rate for each tool element and then for the manufacturing system as a whole. Calculating (box 370) the product fabrication rate begins by discarding all the tool operation times terminated with an alarm event time. The remaining tool operation times are then averaged to create an average tool operation time and the standard deviation of all tool operation times is found. All tool operation times greater than and less than a sum and difference of the average tool operation time and a multiplication factor of the standard deviation (i.e. 3 standard deviations). All tool operation times not discarded are then summed with the product transport times, and the idle duration times. The number of products fabricated is then divided by the summed tool operation times, product transport times, and the idle duration times.

Generally, the fabricated products are grouped in fabrication lots and the tool operation time indicates a time to fabricate one lot of fabricated product and the transport time is the time to transport the fabrication lot. The unit transport time must then be calculated from the number of units of fabricated products per lot.

An example of the calculation of the product fabrication rate is calculating the number of wafers processed per hour (wafers per hour) in a semiconductor process line. A process lot is generally the number of wafers contained in a wafer carrier or 24 wafers in the current technology. Therefore, the process time for a particular tool element or process chamber in the semiconductor process line is determined on a per lot basis as:

$$LPT=2*TP+PT/24\text{wafers}+ST$$

Where:

LPT is the Lot Process Time.

TP is the transport time.

PT is operational or productive time for the lot of wafers (24 wafers).

ST is the idle or standby time, where the lot of wafers is waiting to enter a next tool element.

As mentioned above, the operational or productive time that terminates with an alarm event or requires greater than the average operational time plus or minus a multiplication factor of the standard deviation (3 standard deviations in this example) are discarded. The wafer production rate or throughput is then calculated as:

$$WPH=60LPT$$

Where:

WPT is the product fabrication rate in wafers per hour.

LPT is the Lot Process Time in minutes

Returning to FIG. 2, the tool tracking performance tool 130 transfers the calculated product fabrication rate to the MES database 120. The product fabrication rate or throughput for each process is extracted from the MES database 120 and multiplied (Box 160) by the frequency of use of the particular processes executed by the tool elements 110. This calculation is used to generate the capacity check system report 170.

As described above, the frequency of Box 160 is the number of performances of a given process. The capacity being the amount of production of the fabrication facility. The capacity for production of the various tool elements employed in each process is then calculated to determine the capacity for the fabrication facility. By multiplying the capability of each process and the tool element used in the process times the number of times the process is executed, any bottlenecks with in the fabrication facility can be determined. Understanding the capacity capabilities of the fabrication facility allows verification for planned future production.

The efficiency of the manufacturing system is determined by the manufacturing execution system by acquiring a planned manufacturing system production rate from an engineering planning system in communication with the manufacturing execution system. The manufacturing execution system compares (Box 180) the contents of the capacity check report 170 with the planned manufacturing system production rate. A performance calculator within the manufacturing execution system calculates the production efficiency factor as a percentage of the determined product fabrication rate.

Figure 3:
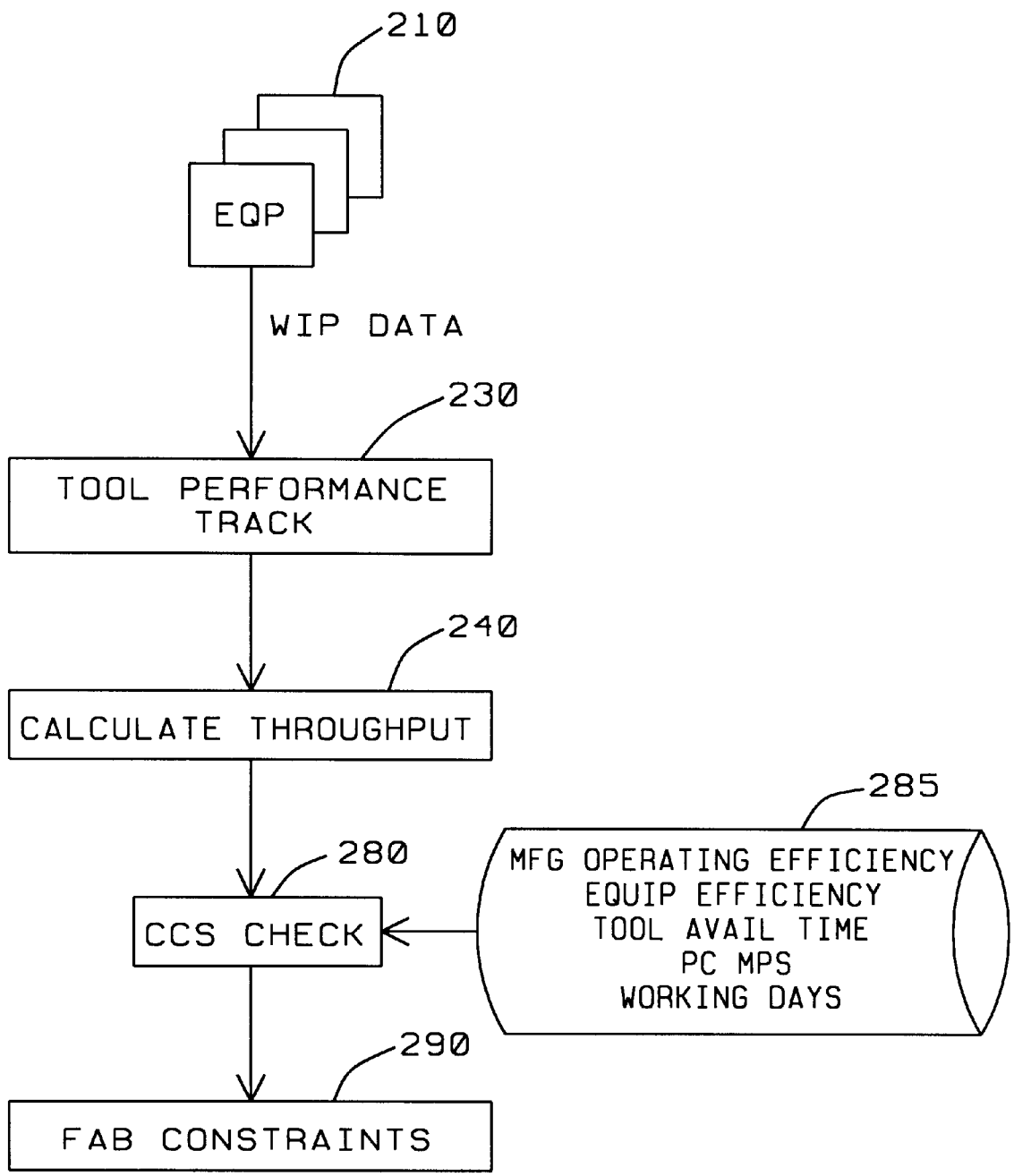
FIG. 3 is a Manufacturing Execution System Process diagram of a second embodiment of this invention.

Refer now to FIG. 3 for a discussion of a second embodiment of the manufacturing execution system and method of this invention. In this instance the tool elements 210 of the manufacturing system are in communication with the tool performance tracking tool 230. The tool performance tracking tool 230 receives and records the sensor data from the tool elements 210 similar to that described in the FIG. 2. The tool performance tracking tool 230 records the events as described in FIG. 4 and using the method described in FIG. 4 calculates (Box 240) the product fabrication rate or throughput.

The manufacturing execution system, as described above, is in communication with the equipment engineering planning system. The manufacturing execution system extracts (Box 285) the planned manufacturing operating efficiency, the tool element efficiency, the tool availability time, the production control manufacturing production schedule, and the number of working days scheduled in a given period.

The capacity check system then calculates the manufacturing system utilization or efficiency as:

$$TU = MPS/WPH*OE*WD*TN*AV$$

Where:
TU is the Total Utilization of the manufacturing system.
MPS is the Manufacturing Product Scheduled.
WPH is the actual product fabrication rate (for the example wafers per hour) that the tool element or manufacturing system is capable of acheiving.
OE is the planned operating efficiency.
WD is the planned operating time in Working Days. The Working Days allocates for times when the manufacturing system is not operational for such events as holidays and vacations.
TN is the number of number of pieces of the tool elements within a manufacturing system.
AV is the availability of the tool elements and the manufacturing system.

The total utilization factor as calculated is compared to the planned utilization factors for each tool element and for the whole manufacturing system. The fabrication constraints are identified (Box 290) for improvement or redesign.

While the above describes a manufacturing execution system to determine the product fabrication rate, efficiency, and utilization of tool elements within a manufacturing system, the apparatus maybe implemented as a program code for execution on a computing system. The program code maybe obtained from media such as storage nodes of the cluster network or the global communication network, or stored on storage media such a read only memory (ROM), or a magnetic disk. The program code executed by the computing system executes the method for determining a product fabrication rate and utilization factor for a tool element within a manufacturing system and the manufacturing system. The program executed is as described in FIGS. 2, 3, and 4.

As described, the manufacturing system of this invention is preferably a semiconductor processing system. However, the method and apparatus of this invention are suitably applicable to other manufacturing systems.

While this invention has been particularly shown and described with reference to the preferred embodiments thereof, it will be understood by those skilled in the art that various changes in form and details may be made without departing from the spirit and scope of the invention.

The invention claimed is:

1. A method for determining a product fabrication rate for a manufacturing process comprising the steps of:
   receiving from sensors within each tool element of a plurality of tool elements data detailing events occurring within each tool element of said plurality of tool elements;
   recording time of occurrence of each of said events;
   from said recording of said time of occurrence, measuring a tool operation time for each tool element of the plurality of tool elements engaged in said manufacturing process;
   from said recording of said time of occurrence, measuring an alarm duration time during fault conditions for any of said tool elements;
   from said recording of said time of occurrence, measuring an idle duration time of each of said tool elements;
   from said recording of said time of occurrence, measuring a product transport time, said product transport time indicating an amount of time that a work-in-process is being transported between tool elements; and
   determining said product fabrication rate as a function of the tool operation time, the alarm duration time, the idle time, and the product transport time.

2. The method of claim 1 wherein the measuring of the tool operation time comprises the steps of:
   determining that the tool element whose operation time is being determined is operating to perform an operation to produce the product
   recording an entry time from said recording of said time of occurrence, said entry time being the time at which said work-in-process enters said tool element;
   recording an alarm event time from said recording of said time of occurrence, said alarm event time being a time at which the tool element has a fault condition and ceases operation;
   recording an operation complete time from said recording of said time of occurrence, said operation complete time being a time at which said tool element has completed the operation on said work-in-process
   determining the later of the alarm event time and the operation complete time;
   if the alarm event time is later than the operation complete time, setting tool operation time as a difference between the alarm event time and the entry time; and
   if the operation complete time is later than the alarm event time, setting the tool operation time as the difference between the operation time complete and the entry time.

3. The method of claim 2 wherein measuring the alarm duration time comprises the steps of:
   recording an alarm event time from said recording of said time of occurrence, said alarm event time being a time at which the tool element has a fault condition and ceases operation;
   recording an alarm clear time from said recording of said time of occurrence, said alarm clear time being a time at which the tool element fault condition is corrected and said tool element able to function; and
   determining the alarm duration time as the difference between the alarm clear time and the alarm event time.

4. The method of claim 1 wherein measuring the idle duration time comprises the steps of:
   recording a tool element operational time from said recording of said time of occurrence, said tool element operational time being a time at which said tool element is set to be able to function;
   recording an alarm clear time from said recording of said time of occurrence said alarm clear time being a time at which the tool element fault condition is corrected and said tool element able to function;
   recording an exit time from said recording of said time of occurrence, said exit time being the time at which a previous work-in-process is removed from said tool element;
   recording an entry time from said recording of said time of occurrence, said entry time being the time at which a next work-in-process enters said tool element; and
   determining said idle duration time as the difference between said entry time and a latest time of said tool element operational time, said alarm clear time, and said exit time.

5. The method of claim 1 wherein measuring the transport time comprising the steps of:

recording of an exit time from said recording of said time of occurrence, said exit time being a time at which said work-in-process is removed from a previous tool element;

recording an entry time, said entry time being a time at which said work-in-process is placed in a next tool element, and determining said transport time as a difference between said exit time and said entry time.

6. The method of claim 1 wherein determining the product fabrication rate comprises the steps of:

discarding all tool operation times terminated with the alarm event time;

averaging all tool operation times to create an average tool operation time;

determining a standard deviation of all tool operation times;

discarding all tool operation times greater than and less than a sum and difference of said average tool operation time and a multiplication factor of said standard deviation;

summing all remaining tool operation times, the product transport times, and the idle duration times; and dividing a number of products fabricated by the summed tool operation times, product transport times, and the idle duration times.

7. The method of claim 6 wherein the fabricated products are grouped in fabrication lots and the tool operation time indicates a time to fabricate one lot of fabricated product and the transport time is the time to transport the fabrication lot.

8. A method for determining an efficiency measurement for a product manufacturing process comprising the steps of:

receiving from sensors within each tool element of a plurality of tool elements data detailing events occurring within each tool element of said plurality of tool elements;

recording time of occurrence of each of said events;

from said recording of said time of occurrence, measuring a tool operation time for each tool element of the plurality of tool elements engaged in said manufacturing process;

from said recording of said time of occurrence, measuring an alarm duration time during fault conditions for any of said tool elements;

from said recording of said time of occurrence, measuring an idle duration time of each of said tool elements;

from said recording of said time of occurrence, measuring a product transport time, said product transport time indicating an amount of time that a work-in-process is being transported between tool elements;

determining said product fabrication rate as a function of the tool operation time, the alarm duration time, the idle time, the product transport time; and comparing a planned manufacturing process product fabrication rate to the determined product fabrication rate to determination the efficiency of said manufacturing process.

9. The method of claim 8 wherein the measuring of the tool operation time comprises the steps of:

determining that the tool element whose operation time is being determined is operating to perform an operation to produce the product recording an entry time from said recording of said time of occurrence, said entry time being the time at which said work-in-process enters said tool element;

recording an alarm event time from said recording of said time of occurrence, said alarm event time being a time at which the tool element has a fault condition and ceases operation;

recording an operation complete time from said recording of said time of occurrence, said operation complete time being a time at which said tool element has completed the operation on said work-in-process determining the later of the alarm event time and the operation complete time;

if the alarm event time is later than the operation complete time, setting tool operation time as a difference between the alarm event time and the entry time; and if the operation complete time is later than the alarm event time, setting the tool operation time as the difference between the operation time complete and the entry time.

10. The method of claim 9 wherein measuring the alarm duration time comprises the steps of:

recording an alarm event time from said recording of said time of occurrence, said alarm event time being a time at which the tool element has a fault condition and ceases operation;

recording an alarm clear time from said recording of said time of occurrence, said alarm clear time being a time at which the tool element fault condition is corrected and said tool element able to function; and determining the alarm duration time as the difference between the alarm clear time and the alarm event time.

11. The method of claim 8 wherein measuring the idle duration time comprises the steps of:

recording a tool element operational time from said recording of said time of occurrence, said tool element operational time being a time at which said tool element is set to be able to function;

recording an alarm clear time from said recording of said time of occurrence, said alarm clear time being a time at which the tool element fault condition is corrected and said tool element able to function;

recording an exit time from said recording of said time of occurrence, said exit time being the time at which a previous work-in-process is removed from said tool element;

recording an entry time from said recording of said time of occurrence, said entry time being the time at which a next work-in-process enters said tool element; and determining said idle duration time as the difference between said entry time and a latest time of said tool element operational time, said alarm clear time, and said exit time.

12. The method of claim 8 wherein measuring the transport time comprising the steps of:

recording of an exit time from said recording of said time of occurrence, said exit time being a time at which said work-in-process is removed from a previous tool element;

recording an entry time from said recording of said time of occurrence, said entry time being a time at which said work-in-process is placed in a next tool element; and determining said transport time as a difference between said exit time and said entry time.

13. The method of claim 8 wherein determining the product fabrication rate comprises the steps of:

discarding all tool operation times terminated with the alarm event time;

averaging all tool operation times to create an average tool operation time;

determining a standard deviation of all tool operation times;

discarding all tool operation times greater than and less than a sum and difference of said average tool operation time and a multiplication factor of said standard deviation;

summing all remaining tool operation times, the product transport times, and the idle duration times; and dividing a number of products fabricated by the summed tool operation times, product transport times, and the idle duration times.

14. The method of claim 13 wherein the fabricated products are grouped in fabrication lots and the tool operation time indicates a time to fabricate one lot of fabricated product and the transport time is the time to transport the fabrication lot.

15. An apparatus for determining a product fabrication rate for a manufacturing process comprising the steps of:

means for receiving from sensors within each tool element of a plurality of tool elements data detailing events occurring within each tool element of said plurality of tool elements;

means for recording time of occurrence of each of said events;

means for measuring a tool operation time for each tool element of the plurality of tool elements engaged in said manufacturing process, from said recording of said time of occurrence;

means for measuring an alarm duration time during fault conditions for any of said tool elements, from said recording of said time of occurrence;

means for measuring an idle duration time of each of said tool elements, from said recording of said time of occurrence;

means for measuring a product transport time, said product transport time indicating an amount of time that a work-in-process is being transported between tool elements, from said recording of said time of occurrence; and means for determining said product fabrication rate as a function of the tool operation time, the alarm duration time, the idle time, and the product transport time.

16. The apparatus of claim 15 wherein the measuring of the tool operation time comprises the steps of:

means for determining that the tool element whose operation time is being determined is operating to perform an operation to produce the product means for recording an entry time from said recording of said time of occurrence, said entry time being the time at which said work-in-process enters said tool element;

means for recording an alarm event time from said recording of said time of occurrence, said alarm event time being a time at which the tool element has a fault condition and ceases operation;

means for recording an operation complete time from said recording of said time of occurrence, said operation complete time being a time at which said tool element has completed the operation on said work-in-process means for determining the later of the alarm event time and the operation complete time;

means for setting tool operation time as a difference between the alarm event time and the entry time, if the alarm event time is later than the operation complete time; and means for setting the tool operation time as the difference between the operation time complete and the entry time, if the operation complete time is later than the alarm event time.

17. The apparatus of claim 16 wherein measuring the alarm duration time comprises the steps of:

means for recording an alarm event time from said recording of said time of occurrence, said alarm event time being a time at which the tool element has a fault condition and ceases operation;

means for recording an alarm clear time from said recording of said time of occurrence, said alarm clear time being a time at which the tool element fault condition is corrected and said tool element able to function; and means for determining the alarm duration time as the difference between the alarm clear time and the alarm event time.

18. The apparatus of claim 15 wherein measuring the idle duration time comprises the steps of:

means for recording a tool element operational time from said recording of said time of occurrence, said tool element operational time being a time at which said tool element is set to be able to function;

means for recording an alarm clear time from said recording of said time of occurrence, said alarm clear time being a time at which the tool element fault condition is corrected and said tool element able to function;

means for recording an exit time from said recording of said time of occurrence, said exit time being the time at which a previous work-in-process is removed from said tool element;

means for recording an entry time from said recording of said time of occurrence, said entry time being the time at which a next work-in-process enters said tool element; and means for determining said idle duration time as the difference between said entry time and a latest time of said tool element operational time, said alarm clear time, and said exit time.

19. The apparatus of claim 15 wherein measuring the transport time comprising the steps of:

means for recording of an exit time from said recording of said time of occurrence, said exit time being a time at which said work-in-process is removed from a previous tool element;

means for recording an entry time from said recording of said time of occurrence, said entry time being a time at which said work-in-process is placed in a next tool element, and means for determining said transport time as a difference between said exit time and said entry time.

20. The apparatus of claim 15 wherein determining the product fabrication rate comprises the steps of:

means for discarding all tool operation times terminated with the alarm event time;

means for averaging all tool operation times to create an average tool operation time;

means for determining a standard deviation of all tool operation times;

means for discarding all tool operation times greater than and less than a sum and difference of said average tool operation time and a multiplication factor of said standard deviation;

means for summing all remaining tool operation times, the product transport times, and the idle duration times; and means for dividing a number of products fabricated by the summed tool operation times, product transport times, and the idle duration times.

21. The apparatus of claim 20 wherein the fabricated products are grouped in fabrication lots and the tool operation time indicates a time to fabricate one lot of fabricated product and the transport time is the time to transport the fabrication lot.

22. An apparatus for determining an efficiency measurement for a product manufacturing process comprising the steps of:

means for receiving from sensors within each tool element of a plurality of tool elements data detailing events occurring within each tool element of said plurality of tool elements;

means for recording time of occurrence of each of said events;

means for measuring a tool operation time for each tool element of the plurality of tool elements engaged in said manufacturing process from said recording of said time of occurrence;

means for measuring an alarm duration time during fault conditions for any of said tool elements from said recording of said time of occurrence;

means for measuring an idle duration time of each of said tool elements from said recording of said time of occurrence;

means for measuring a product transport time from said recording of said time of occurrence, said product transport time indicating an amount of time that a work-in-process is being transported between tool elements;

means for determining said product fabrication rate as a function of the tool operation time, the alarm duration time, the idle time, the product transport time; and means for comparing a planned manufacturing process product fabrication rate to the determined product fabrication rate to determination the efficiency of said manufacturing process.

23. The apparatus of claim 22 wherein the measuring of the tool operation time comprises the steps of:

means for determining that the tool element whose operation time is being determined is operating to perform an operation to produce the product means for recording an entry time, from said recording of said time of occurrence, said entry time being the time at which said work-in-process enters said tool element;

means for recording an alarm event time, from said recording of said time of occurrence, said alarm event time being a time at which the tool element has a fault condition and ceases operation;

means for recording an operation complete time, from said recording of said time of occurrence, said operation complete time being a time at which said tool element has completed the operation on said work-in-process means for determining the later of the alarm event time and the operation complete time;

means for setting tool operation time as a difference between the alarm event time and the entry time, if the alarm event time is later than the operation complete time; and means for setting the tool operation time as the difference between the operation time complete and the entry time, if the operation complete time is later than the alarm event time.

24. The apparatus of claim 23 wherein measuring the alarm duration time comprises the steps of:

means for recording an alarm event time, from said recording of said time of occurrence, said alarm event time being a time at which the tool element has a fault condition and ceases operation;

means for recording an alarm clear time, from said recording of said time of occurrence, said alarm clear time being a time at which the tool element fault condition is corrected and said tool element able to function; and means for determining the alarm duration time as the difference between the alarm clear time and the alarm event time.

25. The apparatus of claim 22 wherein measuring the idle duration time comprises the steps of:

means for recording a tool element operational time, from said recording of said time of occurrence, said tool element operational time being a time at which said tool element is set to be able to function;

means for recording an alarm clear time, from said recording of said time of occurrence, said alarm clear time being a time at which the tool element fault condition is corrected and said tool element able to function;

means for recording an exit time, from said recording of said time of occurrence, said exit time being the time at which a previous work-in-process is removed from said tool element;

means for recording an entry time, from said recording of said time of occurrence, said entry time being the time at which a next work-in-process enters said tool element; and means for determining said idle duration time as the difference between said entry time and a latest time of said tool element operational time, said alarm clear time, and said exit time.

26. The apparatus of claim 22 wherein measuring the transport time comprising the steps of:

means for recording of an exit time, from said recording of said time of occurrence, said exit time being a time at which said work-in-process is removed from a previous tool element;

means for recording an entry time, from said recording of said time of occurrence, said entry time being a time at which said work-in-process is placed in a next tool element, and means for determining said transport time as a difference between said exit time and said entry time.

27. The apparatus of claim 22 wherein determining the product fabrication rate comprises the steps of:

means for discarding all tool operation times terminated with the alarm event time;

means for averaging all tool operation times to create an average tool operation time;

means for determining a standard deviation of all tool operation times;

means for discarding all tool operation times greater than and less than a sum and difference of said average tool operation time and a multiplication factor of said standard deviation;

means for summing all remaining tool operation times, the product transport times, and the idle duration times; and means for dividing a number of products fabricated by the summed tool operation times, product transport times, and the idle duration times.

28. The apparatus of claim 27 wherein the fabricated products are grouped in fabrication lots and the tool operation time indicates a time to fabricate one lot of fabricated product and the transport time is the time to transport the fabrication lot.

29. A manufacturing execution system in communication with a plurality of tool elements of a manufacturing system for determining a product fabrication rate, comprising:

a process data collection device in communication with sensors located on the tool elements to receive tool element status data;

a data retaining means in communication with the process data collection device to record and retain said tool element status data;

a time recording device in communication with the process data collection device and the data retaining means to record times of changes of the tool element status data to the data retaining device; and a production rate calculator in communication with the data retaining means to receive the records of times of changes of tool element status data and from the records of times of changes determining the product fabrication rate for the manufacturing system.

30. The manufacturing execution system of claim 29 wherein the production rate calculator executes the steps of:

measuring a tool operation time for each tool element of the manufacturing system engaged in said manufacturing process;

measuring an alarm duration time during fault conditions for any of said tool elements;

measuring an idle duration time of each of said tool elements;

measuring a product transport time, said product transport time indicating an amount of time that a work-in-process is being transported between tool elements; and determining said product fabrication rate by executing the steps of:

discarding all tool operation times terminated with an alarm event time;

averaging all tool operation times to create an average tool operation time;

determining a standard deviation of all tool operation times;

discarding all tool operation times greater than and less than a sum and difference of said average tool operation time and a multiplication factor of said standard deviation;

summing all remaining tool operation times, the product transport times, and the idle duration times; and dividing a number of products fabricated by the summed tool operation times, product transport times, and the idle duration times.

31. The manufacturing execution system of claim 30 wherein the measuring of the tool operation time comprises the steps of:

determining that the tool element whose operation time is being determined is operating to perform an operation to produce the product recording an entry time, said entry time being the time at which said work-in-process enters said tool element;

recording an alarm event time, said alarm event time being a time at which the tool element has a fault condition and ceases operation;

recording an operation complete time, said operation complete time being a time at which said tool element has completed the operation on said work-in-process determining the later of the alarm event time and the operation complete time;

if the alarm event time is later than the operation complete time, setting tool operation time as a difference between the alarm event time and the entry time; and if the operation complete time is later than the alarm event time, setting the tool operation time as the difference between the operation time complete and the entry time.

32. The manufacturing execution system of claim 30 wherein measuring the alarm duration time comprises the steps of:

recording an alarm event time, said alarm event time being a time at which the tool element has a fault condition and ceases operation;

recording an alarm clear time, said alarm clear time being a time at which the tool element fault condition is corrected and said tool element able to function; and determining the alarm duration time as the difference between the alarm clear time and the alarm event time.

33. The manufacturing execution system of claim 30 wherein measuring the idle duration time comprises the steps of:

recording a tool element operational time, said tool element operational time being a time at which said tool element is set to be able to function;

recording an alarm clear time, said alarm clear time being a time at which the tool element fault condition is corrected and said tool element able to function;

recording an exit time, said exit time being the time at which a previous work-in-process is removed from said tool element;

recording an entry time, said entry time being the time at which a next work-in-process enters said tool element; and determining said idle duration time as the difference between said entry time and a latest time of said tool element operational time, said alarm clear time, and said exit time.

34. The manufacturing execution system of claim 30 wherein measuring the transport time comprising the steps of:

recording of an exit time, said exit time being a time at which said work-in-process is removed from a previous tool element;

recording an entry time, said entry time being a time at which said work-in-process is placed in a next tool element, and determining said transport time as a difference between said exit time and said entry time.

35. The manufacturing execution system of claim 30 wherein the fabricated products are grouped in fabrication lots and the tool operation time indicates a time to fabricate one lot of fabricated product and the transport time is the time to transport the fabrication lot.

36. The manufacturing execution system of claim 30 wherein said manufacturing execution system is in communication with a equipment engineering planning system and the production rate calculator further calculates a production efficiency factor by executing the steps of:

acquiring a planned manufacturing system production rate from the engineering planning system; and comparing the planned manufacturing system production rate to the determined product fabrication rate to determination the efficiency of said manufacturing system.

37. A medium for retaining a computer program for determining a product fabrication rate for a manufacturing process, said computer program executing the steps of:

receiving from sensors within each tool element of a plurality of tool elements data detailing events occurring within each tool element of said plurality of tool elements;

recording time of occurrence of each of said events;

from said recording of said time of occurrence, measuring a tool operation time for each tool element of the plurality of tool elements engaged in said manufacturing process;

from said recording of said time of occurrence, measuring an alarm duration time during fault conditions for any of said tool elements;

from said recording of said time of occurrence, measuring an idle duration time of each of said tool elements;

from said recording of said time of occurrence, measuring a product transport time, said product transport time indicating an amount of time that a work-in-process is being transported between tool elements; and determining said product fabrication rate as a function of the tool operation time, the alarm duration time, the idle time, and the product transport time.

38. The medium of claim 37 wherein the measuring of the tool operation time comprises the steps of:

determining that the tool element whose operation time is being determined is operating to perform an operation to produce the product recording an entry time from said recording of said time of occurrence, said entry time being the time at which said work-in-process enters said tool element;

recording an alarm event time from said recording of said time of occurrence, said alarm event time being a time at which the tool element has a fault condition and ceases operation;

recording an operation complete time from said recording of said time of occurrence, said operation complete time being a time at which said tool element has completed the operation on said work-in-process determining the later of the alarm event time and the operation complete time;

if the alarm event time is later than the operation complete time, setting tool operation time as a difference between the alarm event time and the entry time; and if the operation complete time is later than the alarm event time, setting the tool operation time as the difference between the operation time complete and the entry time.

39. The medium of claim 38 wherein measuring the alarm duration time comprises the steps of:

recording an alarm event time from said recording of said time of occurrence, said alarm event time being a time at which the tool element has a fault condition and ceases operation;

recording an alarm clear time from said recording of said time of occurrence, said alarm clear time being a time at which the tool element fault condition is corrected and said tool element able to function; and determining the alarm duration time as the difference between the alarm clear time and the alarm event time.

40. The medium of claim 37 wherein measuring the idle duration time comprises the steps of:

recording a tool element operational time from said recording of said time of occurrence, said tool element operational time being a time at which said tool element is set to be able to function;

recording an alarm clear time from said recording of said time of occurrence, said alarm clear time being a time at which the tool element fault condition is corrected and said tool element able to function;

recording an exit time from said recording of said time of occurrence, said exit time being the time at which a previous work-in-process is removed from said tool element;

recording an entry time from said recording of said time of occurrence, said entry time being the time at which a next work-in-process enters said tool element; and determining said idle duration time as the difference between said entry time and a latest time of said tool element operational time, said alarm clear time, and said exit time.

41. The medium of claim 37 wherein measuring the transport time comprising the steps of:

recording of an exit time from said recording of said time of occurrence, said exit time being a time at which said work-in-process is removed from a previous tool element;

recording an entry time from said recording of said time of occurrence, said entry time being a time at which said work-in-process is placed in a next tool element, and determining said transport time as a difference between said exit time and said entry time.

42. The medium of claim 37 wherein determining the product fabrication rate comprises the steps of:

discarding all tool operation times terminated with the alarm event time;

averaging all tool operation times to create an average tool operation time;

determining a standard deviation of all tool operation times;

discarding all tool operation times greater than and less than a sum and difference of said average tool operation time and a multiplication factor of said standard deviation;

summing all remaining tool operation times, the product transport times, and the idle duration times; and dividing a number of products fabricated by the summed tool operation times, product transport times, and the idle duration times.

43. The medium of claim 42 wherein the fabricated products are grouped in fabrication lots and the tool operation time indicates a time to fabricate one lot of fabricated product and the transport time is the time to transport the fabrication lot.

44. A medium for retaining a computer program for determining an efficiency measurement for a product manufacturing process comprising the steps of:

receiving from sensors within each tool element of a plurality of tool elements data detailing events occurring within each tool element of said plurality of tool elements;

recording time of occurrence of each of said events;

from said recording of said time of occurrence, measuring a tool operation time for each tool element of the plurality of tool elements engaged in said manufacturing process;

from said recording of said time of occurrence, measuring an alarm duration time during fault conditions for any of said tool elements;

from said recording of said time of occurrence, measuring an idle duration time of each of said tool elements;

from said recording of said time of occurrence, measuring a product transport time, said product transport time indicating an amount of time that a work-in-process is being transported between tool elements;

determining said product fabrication rate as a function of the tool operation time, the alarm duration time, the idle time, the product transport time; and comparing a planned manufacturing process product fabrication rate to the determined product fabrication rate to determination the efficiency of said manufacturing process.

45. The medium of claim 44 wherein the measuring of the tool operation time comprises the steps of:

determining that the tool element whose operation time is being determined is operating to perform an operation to produce the product recording an entry time from said recording of said time of occurrence, said entry time being the time at which said work-in-process enters said tool element;

recording an alarm event time from said recording of said time of occurrence, said alarm event time being a time at which the tool element has a fault condition and ceases operation;

recording an operation complete time from said recording of said time of occurrence, said operation complete time being a time at which said tool element has completed the operation on said work-in-process determining the later of the alarm event time and the operation complete time;

if the alarm event time is later than the operation complete time, setting tool operation time as a difference between the alarm event time and the entry time; and if the operation complete time is later than the alarm event time, setting the tool operation time as the difference between the operation time complete and the entry time.

46. The medium of claim 45 wherein measuring the alarm duration time comprises the steps of:

recording an alarm event time from said recording of said time of occurrence, said alarm event time being a time at which the tool element has a fault condition and ceases operation;

recording an alarm clear time from said recording of said time of occurrence, said alarm clear time being a time at which the tool element fault condition is corrected and said tool element able to function; and determining the alarm duration time as the difference between the alarm clear time and the alarm event time.

47. The medium of claim 44 wherein measuring the idle duration time comprises the steps of:

recording a tool element operational time from said recording of said time of occurrence, said tool element operational time being a time at which said tool element is set to be able to function;

recording an alarm clear time from said recording of said time of occurrence, said alarm clear time being a time at which the tool element fault condition is corrected and said tool element able to function;

recording an exit time from said recording of said time of occurrence, said exit time being the time at which a previous work-in-process is removed from said tool element;

recording an entry time from said recording of said time of occurrence, said entry time being the time at which a next work-in-process enters said tool element; and determining said idle duration time as the difference between said entry time and a latest time of said tool element operational time, said alarm clear time, and said exit time.

48. The medium of claim 44 wherein measuring the transport time comprising the steps of:

recording of an exit time from said recording of said time of occurrence, said exit time being a time at which said work-in-process is removed from a previous tool element;

recording an entry time from said recording of said time of occurrence, said entry time being a time at which said work-in-process is placed in a next tool element, and determining said transport time as a difference between said exit time and said entry time.

49. The medium of claim 44 wherein determining the product fabrication rate comprises the steps of:

discarding all tool operation times terminated with the alarm event time;

averaging all tool operation times to create an average tool operation time;

determining a standard deviation of all tool operation times;

discarding all tool operation times greater than and less than a sum and difference of said average tool operation time and a multiplication factor of said standard deviation;

summing all remaining tool operation times, the product transport times, and the idle duration times; and dividing a number of products fabricated by the summed tool operation times, product transport times, and the idle duration times.

50. The medium of claim 49 wherein the fabricated products are grouped in fabrication lots and the tool operation time indicates a time to fabricate one lot of fabricated product and the transport time is the time to transport the fabrication lot.

* * * * *